(12) United States Patent
Blamon et al.

(10) Patent No.: US 12,294,344 B2
(45) Date of Patent: May 6, 2025

(54) INTEGRATED CIRCUIT COMPRISING AN ADAPTATION AND FILTERING NETWORK INCLUDING A DIRECT CURRENT POWER SUPPLY STAGE, AND CORRESPONDING ADAPTATION AND FILTERING PROCESS

(71) Applicant: STMicroelectronics International N.V., Geneva (CH)

(72) Inventors: Guillaume Blamon, Courbevoie (FR); Emmanuel Picard, Tours (FR); Christophe Boyavalle, Triel sur seine (FR)

(73) Assignee: STMicroelectronics International N.V., Geneva (CH)

( * ) Notice: Subject to any disclaimer, the term of this patent is extended or adjusted under 35 U.S.C. 154(b) by 350 days.

(21) Appl. No.: 17/800,282

(22) PCT Filed: Feb. 15, 2021

(86) PCT No.: PCT/EP2021/053673
§ 371 (c)(1),
(2) Date: Aug. 17, 2022

(87) PCT Pub. No.: WO2021/165211
PCT Pub. Date: Aug. 26, 2021

(65) Prior Publication Data
US 2023/0083695 A1 Mar. 16, 2023

(30) Foreign Application Priority Data
Feb. 17, 2020 (EP) ..................................... 20157674

(51) Int. Cl.
*H03H 7/00* (2006.01)
*H03F 1/56* (2006.01)
(Continued)

(52) U.S. Cl.
CPC ............. *H03H 7/0115* (2013.01); *H03F 1/56* (2013.01); *H03F 3/245* (2013.01);
(Continued)

(58) Field of Classification Search
CPC .......... H03H 7/00; H03H 7/0115; H03H 7/38; H03H 7/40; H03H 7/1758; H03H 7/176; H03F 1/56; H03F 1/565
(Continued)

(56) References Cited

U.S. PATENT DOCUMENTS 9,503,025 B2 * 11/2016 Cao .......................... H03F 3/245
9,979,357 B2 * 5/2018 Shounai .................... H03F 1/32
(Continued)

FOREIGN PATENT DOCUMENTS

WO 02073794 A2 9/2002

*Primary Examiner* — Hai L Nguyen
(74) *Attorney, Agent, or Firm* — Slater Matsil, LLP

(57) ABSTRACT

The integrated circuit includes a power amplifier, an antenna, and a matching and filtering network including a direct current power supply stage on an output node of the power amplifier, a first section, and a second section. The direct current power supply stage and the two sections include inductor-capacitor "LC" arrangements configured to have an impedance that is matched to the output of the power amplifier in the fundamental frequency band. The LC arrangements of the direct current power supply stage and of the first section are furthermore configured to have resonant frequencies that are respectively adapted to attenuate harmonic frequency bands of the fundamental frequency band.

20 Claims, 5 Drawing Sheets

(51) Int. Cl.
*H03F 3/24* (2006.01)
*H03H 7/01* (2006.01)

(52) U.S. Cl.
CPC ..... *H03H 7/1758* (2013.01); *H03F 2200/171* (2013.01); *H03F 2200/387* (2013.01); *H03F 2200/451* (2013.01)

(58) Field of Classification Search
USPC .......................................... 333/32, 175, 176
See application file for complete search history.

(56) References Cited

U.S. PATENT DOCUMENTS

| | | |
|---|---|---|
| 2010/0141168 A1 | 6/2010 | Zhang et al. |
| 2014/0073267 A1 | 3/2014 | Cabanillas et al. |
| 2016/0013758 A1 | 1/2016 | Cao et al. |
| 2017/0338775 A1 | 11/2017 | Shounai et al. |
| 2023/0129447 A1* | 4/2023 | Blamon ............... H03H 7/1766 343/860 |

* cited by examiner

INTEGRATED CIRCUIT COMPRISING AN ADAPTATION AND FILTERING NETWORK INCLUDING A DIRECT CURRENT POWER SUPPLY STAGE, AND CORRESPONDING ADAPTATION AND FILTERING PROCESS

CROSS-REFERENCE TO RELATED APPLICATIONS

This application is a national stage of International Application No. PCT/EP2021/053673, filed on Feb. 15, 2021, which claims priority to European Patent Application No. 20157674.1, filed on Feb. 17, 2020, which applications are hereby incorporated by reference herein in their entirety.

TECHNICAL FIELD

Embodiments and implementations relate to integrated circuits including a matching and filtering network, typically between an output of a power amplifier and an antenna.

BACKGROUND

On the one hand, power amplifiers operate at maximum efficiency when the load on the outputs thereof is at optimum impedance. The optimum impedance at the output of a power amplifier typically differs from the impedance of the antennas connected thereto.

As a result, impedance matching circuits are conventionally provided between the output of the power amplifiers and the antennas in order to transform the impedances of the antennas into the ideal impedances of the amplifiers. Impedance matching circuits are typically produced using passive components such as inductive elements and capacitive elements. Impedance matching circuits occupy a potentially large surface area, which can be particularly detrimental when the impedance matching circuit is produced in a small integrated circuit.

On the other hand, the emission spectra of the power amplifiers typically contain interfering signals, such as harmonic frequencies of the fundamental frequency or noise due to the internal non-linearity of the power amplifiers.

As a result, filtering circuits are conventionally provided between the output of the power amplifiers and the antennas in order to filter in particular the harmonic frequency bands, for example up to the fifth order. The filtering circuits are typically produced using passive components such as resistive elements, inductive elements, and capacitive elements, and also occupy a potentially large surface area which is particularly detrimental when the impedance matching circuit is produced in an integrated manner.

Impedance matching and filtering circuits have specific constraints and are conventionally designed separately.

Although techniques separating the two functions (impedance matching and filtering) are satisfactory in terms of performance, these techniques require numerous passive components, making them expensive and cumbersome.

However, reducing the size of the integrated circuits reduces the surface area available for the passive devices, making it more difficult to integrate the two functions with satisfactory performance levels.

The use of Surface Acoustic Wave (SAW) filters reduces the space required, however increases costs.

As a result, there is a need for compact and inexpensive solutions that can implement impedance matching and filtering and procure good performance levels.

SUMMARY

According to embodiments and implementations, the invention proposes providing impedance matching and filtering in a single network, wherein impedance matching is provided by a network with a minimum quality factor, in order to obtain the best response over the widest possible frequency range while keeping the number of passive elements as low as possible; filtering is provided by replacing passive elements with inductor-capacitor arrangements wisely chosen so as to resonate at the frequencies to be filtered without modifying the impedance transformation in the transmission frequencies. In particular, the resonant frequencies of the inductor-capacitor arrangements are chosen so as to optimise the size and response of the network.

In this respect, one aspect proposes an integrated circuit including a power amplifier intended to provide a signal in a fundamental frequency band, an antenna, and a matching and filtering network including:

a direct current power supply stage between a supply voltage node and an output node of the power amplifier;

a first section between the output node of the power amplifier and an intermediate node; and a second section between the intermediate node and an input node of the antenna, the direct current power supply stage and the two sections including inductor-capacitor "LC" arrangements configured to have an impedance that is matched to the output of the power amplifier in the fundamental frequency band, wherein the LC arrangements of the direct current power supply stage and of the first section are furthermore configured to have resonant frequencies that are respectively adapted to attenuate harmonic frequency bands of the fundamental frequency band.

For convenience and in accordance with conventional use in electronics, the notation "LC" is used to designate the terms "inductor-capacitor".

Thus, a matching and filtering network with two LC arrangement sections is proposed, wherein all of the LC arrangements of the direct current power supply stage and of the first section are configured for both impedance matching and harmonic frequency filtering.

In particular, it should be noted that the LC arrangements of the direct current power supply stage and of the first section are configured for the simultaneous matching and filtering functions, unlike conventional techniques wherein one arrangement is dedicated to matching and another, at least partially separate, arrangement is dedicated to filtering.

As a result, the design according to this aspect, which proposes a complete merging of the matching and filtering functions in the LC arrangements of the direct current power supply stage and of the first section, allows a particularly compact integrated circuit to be produced, without loss of performance or increase in cost.

According to one embodiment, the LC arrangements of the second section include an LC arrangement configured to have a resonant frequency adapted to attenuate a harmonic frequency band of the fundamental frequency band, and an inductive or capacitive element configured to not introduce resonance adapted to attenuate harmonic frequency bands of the fundamental frequency band.

The inductive or capacitive element that does not integrate an LC arrangement in the second section is dedicated to impedance matching, and in particular allows high frequency attenuation to be maintained.

According to one embodiment, the second section includes a series LC arrangement coupled between the input node of the antenna and a ground node and an inductive element coupled between the intermediate node and the input node of the antenna, or a parallel LC arrangement coupled between the intermediate node and the input node of the antenna and a capacitive element coupled between the intermediate node and a ground node.

In other words, the second section can be provided with a series-coupled inductive element, dedicated to impedance matching and allowing high frequencies to be filtered, and with a series LC arrangement shunt-coupled to ground to remove signals around the resonant frequency thereof; or alternatively with a shunt-coupled capacitive element, dedicated to impedance matching and allowing for high-frequency filtering, and with a series-coupled parallel LC arrangement to block signals around the resonant frequency thereof.

According to one embodiment, the first section includes a series LC arrangement coupled between the output node of the power amplifier and a ground node and the second section includes a series LC arrangement coupled between the input node of the antenna and a ground node, the series LC arrangement of the second section being configured to have a resonant frequency greater than the resonant frequency of the series LC arrangement of the first section.

More specifically, for impedance matching, the capacitive elements are usually larger on the power amplifier side than on the antenna side. On the other hand, the resonant frequency of an LC arrangement is inversely proportional to the size of the inductive and capacitive elements of the LC arrangement. As a result, this embodiment proposes positioning the resonant frequencies in an optimised manner for the sizes of the inductive elements added to resonate the capacitive elements provided for impedance matching. The overall space requirement, in particular the space required by the inductive elements of the series LC arrangements, is thus optimised to be as small as possible.

According to one embodiment, the direct current power supply stage includes a low-pass T-shaped LC arrangement, and the first section includes a parallel LC arrangement coupled between the output node of the power amplifier and the intermediate node and a series LC arrangement coupled between the intermediate node and a ground node.

The term "low-pass T-shaped LC arrangement" is understood to mean a typical inductor-capacitor arrangement including two inductive elements coupled in series and connected at a central node, and a capacitive element coupled between the central node and the ground.

Thus, the parallel LC arrangements block signals at the resonant frequencies thereof, whereas the series LC arrangements route signals at the resonant frequencies thereof to ground. The low-pass T-shaped LC arrangement incorporates additional filtering by the inductive element coupled on the output node of the amplifier in series with the capacitive element coupled to ground.

According to one embodiment, the parallel LC arrangement of the first section is configured to have the highest resonant frequency among the resonant frequencies of the LC arrangements adapted to attenuate the harmonic frequency bands of the fundamental frequency band.

This embodiment is particularly advantageous as regards an additional constraint which arises when the fundamental frequency band is intended for high frequencies, i.e. frequencies beyond which interfering inductive elements associated with the metallic connections, in particular metallic connections to ground, have effects which are no longer negligible at these frequencies, in particular in the harmonic frequency bands of the fundamental band.

More specifically, interfering inductive elements resulting from physical connections to ground can cause the resonance of the capacitive elements coupled to ground (through an interfering arrangement equivalent to a series LC arrangement) at frequencies that can be lower than harmonic frequency bands, for example fourth and fifth harmonics.

As a result, this embodiment provides for attenuating the fourth and fifth harmonic frequency bands by the resonant frequency of the parallel LC arrangement of the first section, which is not subject to the problems of interfering inductances on the ground connections.

Moreover, the resonant frequency of the one or more series LC arrangements in each section (the first and the second sections) can be chosen so as to be distributed in the harmonic frequency bands still to be attenuated (for example of the second and third harmonics), so as to incorporate an inductive element of minimal size combined with a capacitive element intended for impedance matching.

More specifically, since the value of the inductive element required to resonate a capacitive element is inversely proportional to the capacitive value and to the square of the resonant frequency, the highest resonant frequencies are advantageously associated with the lowest capacitive values, in order to minimise the value of the inductive element to be added.

This again allows the overall space requirement to be optimised by positioning the resonant frequencies in a way that is optimised for the sizes of the inductive elements enabling the filtering function in each section.

In this regard, according to one embodiment, the LC arrangements are configured according to at least one of the following criteria:

the low-pass T-shaped LC arrangement of the direct current power supply stage is configured to have a resonant frequency in one half of the second harmonic frequency band;
  the series LC arrangement of the first section is configured to have a resonant frequency in the other half of the second harmonic frequency band;
  the series LC arrangement of the second section is configured to have a resonant frequency in the third harmonic frequency band;
  the parallel LC arrangement of the first section is configured to have a resonant frequency either between the fourth harmonic frequency band and the fifth harmonic frequency band, or in a common portion of the fourth harmonic frequency band and of the fifth harmonic frequency band.

This embodiment offers possibilities for positioning the resonant frequencies to optimise the overall space requirement, and for optimum performance.

In particular, the positioning of the resonant frequency of the parallel LC arrangement of the first section (and not of the series LC arrangement of the second section) in the fourth and fifth harmonic frequency band is noted. This positioning advantageously prevents potential problems caused by interfering inductive elements linked to the metallic connections (especially those to ground), the effects whereof are no longer negligible when the frequency is increased, in particular in the fourth and fifth harmonic frequency bands.

According to another aspect, the invention proposes a method for impedance matching and filtering between an output of a power amplifier providing a signal in a fundamental frequency band and an antenna, comprising a dimensioning of a virtual matching network including:

a direct current power supply stage between a supply voltage node and an output node of the power amplifier;

a first section between the output node of the power amplifier and an intermediate node; and a second section between the intermediate node and an input node of the antenna, the direct current power supply stage including an inductive element, the first section and the second section including an inductive element and a capacitive element, the dimensioning being produced so as to have an impedance that is matched to the output of the power amplifier in the fundamental frequency band, wherein the method comprises producing a real matching and filtering network comprising replacing the inductive element of the direct current power supply stage, and the inductive and capacitive elements of the first section of the virtual matching network, with respective "LC" inductor-capacitor arrangements, configured to have an equivalent impedance matched to the output of the power amplifier in the fundamental frequency band, and to further have resonant frequencies respectively adapted to attenuate harmonic frequency bands of the fundamental frequency band.

The method according to this aspect proposes a dimensioning of a virtual impedance matching network, not providing the filtering function, in order to firstly dimension the requirements for impedance matching.

The term "virtual" is understood to mean, for example, "that which exists in the state of mere possibility or eventuality, but not in the state of material realisation", such as in particular an intermediate calculation.

Secondly, the filtering is then introduced into the real, as opposed to the "virtual", matching and filtering network, i.e. the matching and filtering network "that really exists for matching and filtering a transmission signal". The real matching and filtering network is obtained by replacing the virtual elements with real elements that are equivalent for the impedance matching needs, and that additionally have filtering functions.

In practice, this method allows the matching and filtering functions to be fully merged in the LC arrangements of the first section and of the second section in a compact, efficient and inexpensive manner, for any embodiment of the power amplifier and antenna.

According to one implementation, said production of the real matching and filtering network comprises replacing the inductive element or the capacitive element of the second section of the virtual matching network with an "LC" inductor-capacitor arrangement, configured to have an equivalent impedance matched to the output of the power amplifier in the fundamental frequency band, and to further have a resonant frequency that is adapted to attenuate harmonic frequency bands of the fundamental frequency band.

According to one implementation, the second section of the virtual matching network includes an inductive element coupled between the intermediate node and the input node of the antenna, and a capacitive element coupled between the input node of the antenna and a ground node, and wherein said production of the real matching and filtering network comprises replacing the capacitive element by a series LC arrangement, or replacing the inductive element by a parallel LC arrangement.

According to one implementation, the production of the real matching and filtering network comprises replacing the capacitive elements of the virtual matching network with series LC arrangements in the first section and the second section, and wherein the resonant frequency of the series LC arrangement of the second section is chosen such that it is higher than the resonant frequency of the series LC arrangement of the first section.

According to one implementation, the first section of the virtual matching network includes an inductive element coupled between the output node of the power amplifier and the intermediate node, and a capacitive element coupled between the intermediate node and a ground node, and wherein said production of the real matching and filtering network comprises replacing the inductive element of the direct current power supply stage of the virtual matching network with a low-pass T-shaped LC arrangement, and replacing the inductive element of the first section with a parallel LC arrangement, and the capacitive element of the first section with a series LC arrangement.

According to one implementation, the resonant frequency of the parallel LC arrangement of the first section is chosen such that it is the highest from among the resonant frequencies of the LC arrangements adapted to attenuate harmonic frequency bands of the fundamental frequency band.

According to one implementation, the real matching and filtering network is produced according to at least one of the following criteria:

the T-shaped LC arrangement of the direct current power supply stage has a resonant frequency in one half of the second harmonic frequency band;

the series LC arrangement of the first section has a resonant frequency in the other half of the second harmonic frequency band;

the series LC arrangement of the second section has a resonant frequency in the third harmonic frequency band;

the parallel LC arrangement of the first section has a resonant frequency either between the fourth harmonic frequency band and the fifth harmonic frequency band, or in a common portion of the fourth harmonic frequency band and of the fifth harmonic frequency band.

BRIEF DESCRIPTION OF THE DRAWINGS

Other advantages and features of the invention will become apparent upon examining the detailed description of non-limiting embodiments and implementations, and from the accompanying drawings in which.

DETAILED DESCRIPTION OF ILLUSTRATIVE EMBODIMENTS

Figure 1:
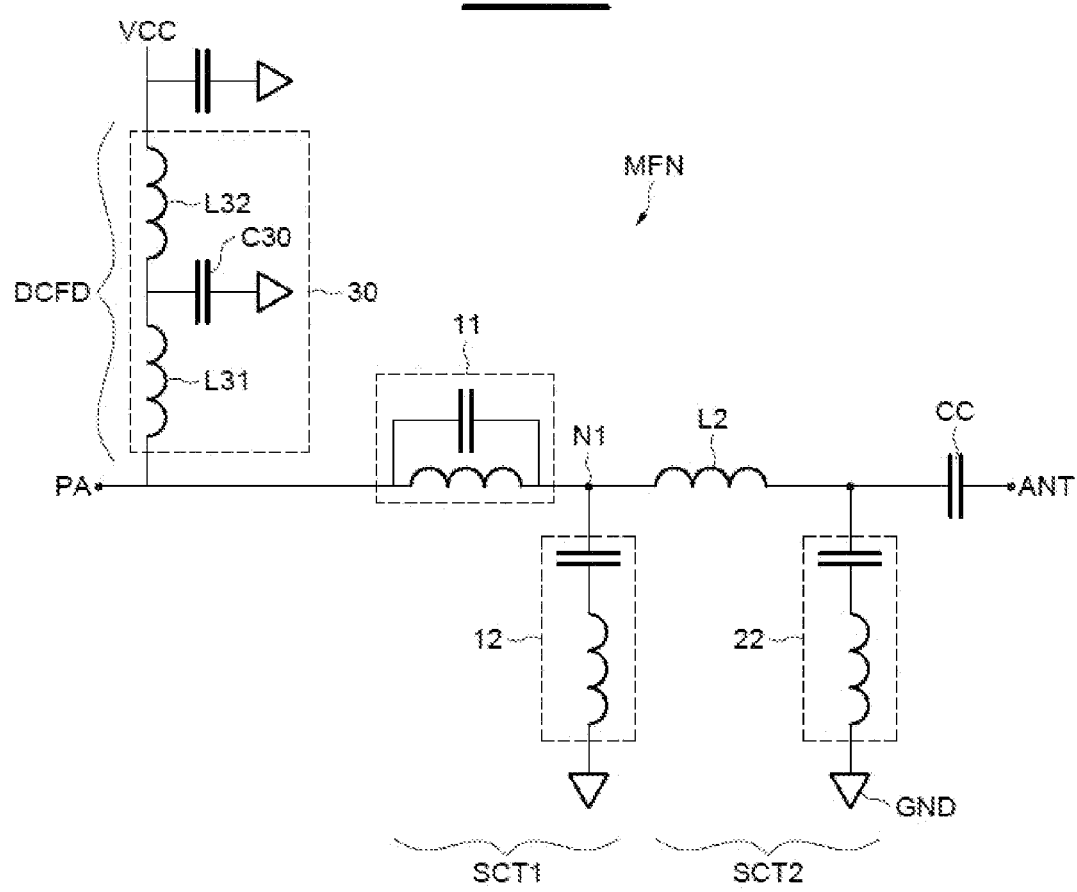
FIG. 1 is a diagram of an embodiment matching and filtering network circuit.

FIG. 1 shows a matching and filtering network MFN between an output node of a power amplifier PA and an input node of an antenna ANT, for example integrated into an integrated circuit.

The power amplifier PA is configured to provide a transmission signal in a fundamental frequency band, in particular radio frequencies adapted for wireless communications, such as 4G, 5G or LTE, Wi-Fi or Bluetooth telecommunications for example.

The matching and filtering network MFN includes two matching and filtering sections SCT1, SCT2, and a direct current power supply stage DCFD.

The direct current power supply stage DCFD includes two inductive elements L11, L12 in series between a supply voltage terminal VCC and the output node of the power amplifier PA, and a decoupling capacitive element between the supply voltage terminal VCC and a ground reference voltage terminal GND.

The direct current power supply stage DCFD on the one hand allows the necessary voltage level and current for the matching and filtering network MFN to be supplied from the output node of the power amplifier PA.

The inductive elements L31, L32 in series are configured to present the imaginary part of the ideal impedance of the power amplifier PA at the output node of the power amplifier PA.

The direct current power supply stage DCFD further includes another capacitive element C3 coupled to a central node between the two inductive elements L11, L12 and the ground GND, so as to form a low pass T-shaped arrangement 30. A low-pass T-shaped arrangement is a conventional LC filter structure, so named because of the shape of the wiring diagram thereof, which is similar to the letter T.

The low-pass T-shaped inductor-capacitor arrangement 30 does not affect the power supply function of the stage DCFD, but adds a short circuit effect to ground, usually referred to as a shunt, for signals at the resonant frequency thereof.

More specifically, the first inductive element L31 and the capacitive element C30 can be considered as a series LC arrangement mounted between the output node of the power amplifier PA and the ground GND, thus adapted to attenuate the transmission signal at the resonant frequency.

The T-shaped LC arrangement 30, in particular the elements L31 and C30, is configured to have a resonant frequency that is adapted to attenuate a harmonic frequency band of the fundamental frequency band.

Harmonics are frequencies that are equal to integer multiples of the fundamental frequency of the transmission signal.

The first section SCT1 is located between the output node of the power amplifier PA and an intermediate node N1, the second section SCT2 is located between the intermediate node N1 and an input node of the antenna ANT.

Each of the two sections SCT1, SCT2 includes inductive elements and capacitive elements, i.e. inductor-capacitor arrangements that are conventionally referred to as "LC" arrangements for convenience.

The LC arrangements of the two sections SCT1, SCT2 are configured to have an impedance that is matched to the output of the power amplifier PA in the fundamental frequency band.

The impedance is matched to the output of the power amplifier PA in that, at this impedance, the amplifier supplies the desired power to the antenna with the best possible efficiency.

Moreover, the LC arrangements of the first section SCT1 and of the second section SCT2 are furthermore configured to have resonant frequencies that are respectively adapted to attenuate harmonic frequency bands of the fundamental frequency band.

In particular, the first section SCT1 includes a parallel LC arrangement 11 coupled between the output node of the power amplifier PA and the intermediate node N1, as well as a series LC arrangement 12 coupled between the intermediate node N1 and a ground node GND.

The second section SCT2 includes an inductive element L2 coupled between the intermediate node N1 and the input node of the antenna ANT, as well as a series LC arrangement 22 coupled between the input node of the antenna ANT and the ground node GND.

The inductive element L2 is not integrated into a resonant LC arrangement providing a filtering function at a resonant frequency, but nevertheless allows attenuation to be maintained at high and very high frequencies. In particular, the inductive element L2 of the second section is dedicated to impedance matching.

Alternatively (not shown), the second section SCT2 can include a capacitive element coupled between the input node of the antenna ANT and the ground node GND, as well as a parallel LC arrangement coupled between the intermediate node N1 and the input node of the antenna ANT.

The capacitive element of this alternative embodiment is not integrated into a resonant LC arrangement providing a filtering function at a resonant frequency, but nevertheless allows attenuation to be maintained at high and very high frequencies. The capacitive element of the second section according to this alternative embodiment is in particular dedicated to impedance matching.

It should be noted that a coupling capacitor CC is conventionally provided between the input node of the antenna and the antenna ANT, to block the direct current component of the voltage, and the capacitive value thereof is chosen such that it is large enough to have a negligible impact on impedance matching.

Thus, the parallel LC arrangement 11 of the first section SCT1 blocks the transmission of the signals at the resonant frequency thereof along the serial channel from the output of the power amplifier PA to the antenna ANT, via the intermediate node N1. The same applies to the parallel LC arrangement of the second section SCT2, in the case of the aforementioned alternative embodiment.

Moreover, the series LC arrangements 12, 22 route the signals at the resonant frequencies thereof flowing from the output of the power amplifier PA to the antenna ANT, via the intermediate node N1, to ground GND (conventionally referred to as a shunt).

Figure 5:
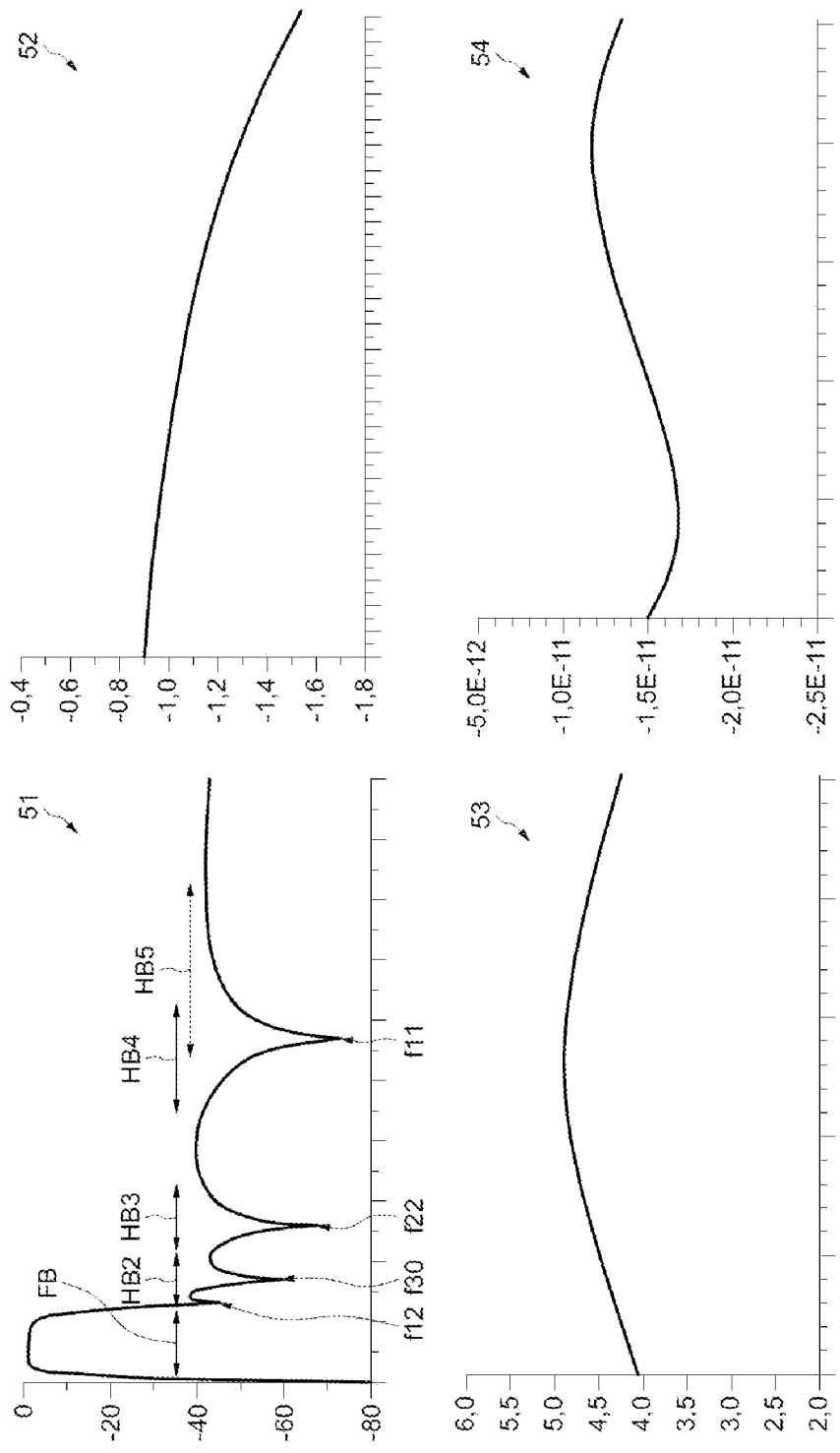
FIG. 5 is a set of charts of an embodiment for the resulting matching and filtering network circuit.

According to one advantageous example embodiment, the parallel LC arrangement 11 is configured in a dual manner to have, on the one hand, an equivalent impedance corresponding to an impedance of an inductive element intended for said impedance matching in the fundamental frequency band (FIG. 2), and, on the other hand, to have a resonant frequency f11 (FIG. 5) chosen in one of the harmonic frequency bands (FIG. 5).

Similarly, each series LC arrangement 12, 22 is advantageously configured in a dual manner to have, on the one hand, an equivalent impedance corresponding to an impedance of a capacitive element intended for said impedance matching in the fundamental frequency band (FIG. 2), and to have a resonant frequency f12, f22 (FIG. 5) chosen in one of the harmonic frequency bands (FIG. 5) allowing the inductive value of the series LC arrangement to be minimised to this equivalent impedance.

In particular, it should be noted that each LC arrangement 11,12, 30 of the direct current power supply stage DCFD and of the first section SCT1 is configured, as a whole, simultaneously for the matching and filtering functions. That is to say that there are no components in the LC arrangements of the direct current power supply stage DCFD and of the first section SCT1 that are dedicated solely to the impedance matching function or solely to the filtering function.

More specifically, the decoupling capacitive element between the supply voltage VCC and the ground GND (as well as the capacitive element CC between the input node of the antenna and the antenna ANT), are usually always provided and can be considered separately from the circuit of the matching and filtering network MFN.

Moreover, the second section SCT2 includes, on the one hand, an LC arrangement 22 which is entirely configured simultaneously for the matching and filtering functions, and separately includes an inductive element L2 dedicated to impedance matching only, nonetheless allowing for high-frequency filtering.

In the aforementioned alternative embodiment, the inductive element L2 can be replaced by a parallel LC arrangement which is entirely configured simultaneously for the matching and filtering functions, and the series LC arrangement 22 can be replaced by a capacitive element separately dedicated to impedance matching only, nonetheless allowing for high-frequency filtering.

In another alternative embodiment (not shown), the second section SCT2 could comprise the inductive element L2 coupled between the intermediate node N1 and the input node of the antenna ANT, and a capacitive element coupled between the input node of the antenna ANT and the ground GND, both dedicated to impedance matching only. This further alternative embodiment can improve high-frequency filtering, but in exchange for less peak attenuation at a resonant frequency, i.e. poorer selectivity of the harmonic frequency attenuation.

Figure 2:
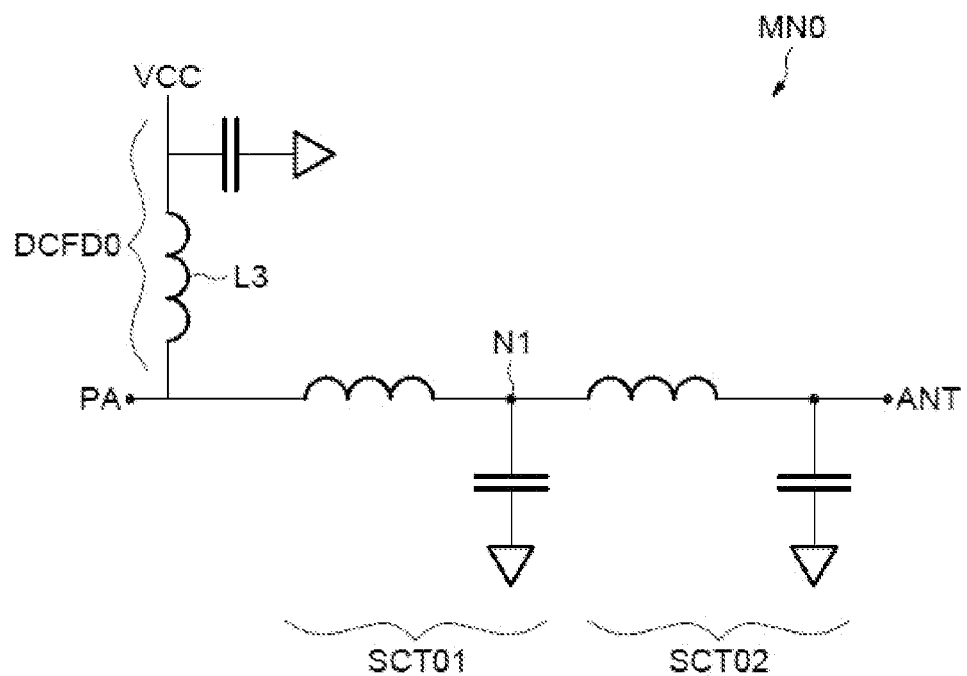
FIG. 2 is a diagram of an embodiment virtual matching network circuit.
Figure 3:
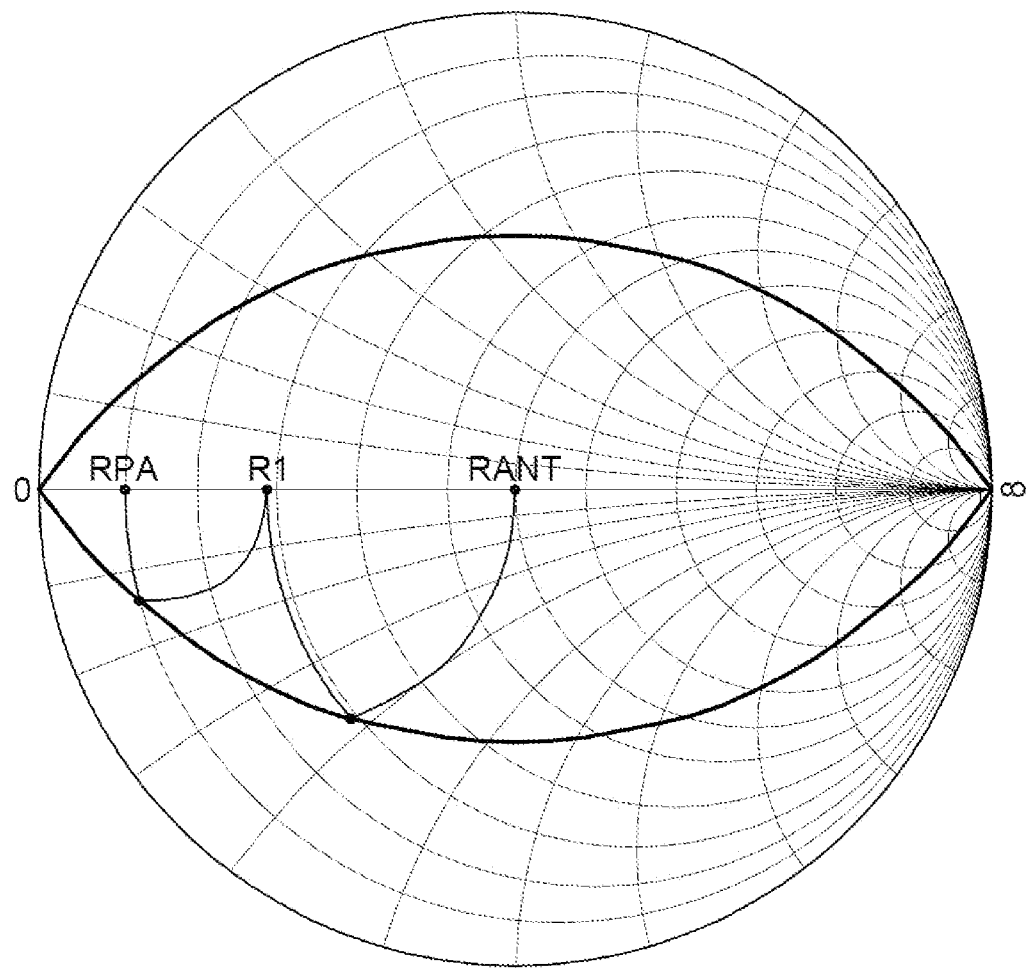
FIG. 3 is a Smith chart plot of an embodiment normalized by the impedance of an antenna.
Figure 4:
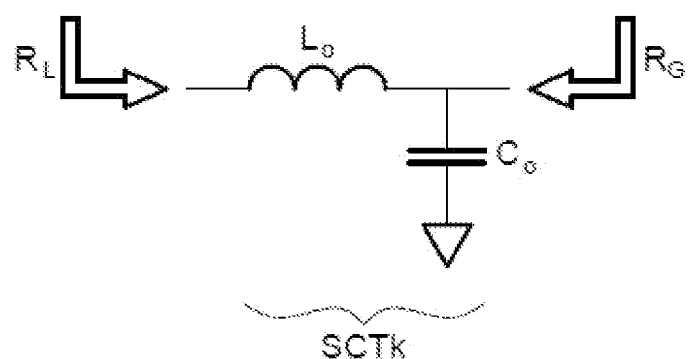
FIG. 4 is a diagram of an embodiment LC circuit.

Reference is made to FIGS. 2 to 4 to show an advantageous method of dimensioning the inductive and capacitive elements of the impedance matching and filtering network MFN described hereinabove with reference to FIG. 1.

FIG. 2 shows a virtual matching network MN0 which will act as a reference base for dimensioning the inductive and capacitive elements of the matching and filtering network MFN described with reference to FIG. 1.

The matching network MN0 is described as "virtual" because this network is only used for calculation purposes in order to size the impedance matching requirements. The results of the dimensioning will be used as a basis of calculation for assessing the components actually produced to implement the matching and filtering by the network MFN described with reference to FIG. 1.

The virtual matching network MN0 includes two virtual matching sections SCT01, SCT02, and a virtual direct current power supply stage DCFD0.

Each of the two virtual sections SCT01, SCT02 includes an inductive element on the serial channel from the output node of the power amplifier PA to the input node of the antenna ANT, via the intermediate node N1, and a capacitive element shunt-coupled to ground GND, and on the intermediate node N1 and the input node of the antenna ANT.

The virtual matching network MN0 thus corresponds to a low-pass network with a minimum quality factor in two sections SCT01, SCT02 provided to match the impedance between the output of the power amplifier PA and the antenna ANT.

Reference is now made to FIG. 3.

FIG. 3 shows a Smith chart normalised by the impedance of the antenna ANT, so that the impedance of the antenna RANT is located in the centre of the Smith chart.

Dimensioning is carried out in such a way that the impedance of the antenna RANT is transformed into the ideal impedance of the power amplifier RPA.

For this purpose, an intermediate impedance R1 is calculated by the geometrical mean between the antenna impedance RANT and the ideal impedance RPA presented on the output node of the power amplifier PA.

In other words: R1=(RA×RL)½

Strictly speaking, the calculation is carried out with RPA being the inverse of the real part of the admittance presented at the output node of the power amplifier PA, and RANT being the inverse of the real part of the admittance presented by the antenna ANT.

The intermediate impedance R1 corresponds to the impedance (strictly speaking to the inverse of the real part of the admittance) that would be presented on the intermediate node N1 of the virtual matching network MN0.

The values of the capacitive elements $C_0$ and of the inductive elements $L_0$, (FIG. 4) are derived for each section SCT01, SCT02 (or SCTk—FIG. 4) by reading the Smith chart, and by the equations EQ1 and EQ2 defined with reference to FIG. 4.

$$C_0 = \frac{1}{R_G \cdot \omega} \times \sqrt{\frac{R_G}{R_L} - 1} \qquad \text{EQ 1}$$

$$L_0 = \frac{R_L}{\omega} \times \sqrt{\frac{R_G}{R_L} - 1} \qquad \text{EQ 2}$$

Where ω is the angular frequency at a frequency (f0) chosen from the fundamental frequency band, RL is the impedance (strictly speaking the inverse of the real part of the admittance) presented to the left of each section SCTk, k∈[01; 02], and RG is the impedance (strictly speaking the inverse of the real part of the admittance) presented to the right of each section SCTk, as shown in FIG. 4.

The imaginary part of the admittance of the load on the output node of the power amplifier PA is produced by the inductive element L3 of the virtual direct current power supply stage DCFD0, by which the power amplifier PA is powered.

The method then comprises producing the real matching and filtering network MFN, as described hereinabove with reference to FIG. 1, from the inductive L0 and capacitive C0 elements thus dimensioned in each section SCT01, SCT02 of the virtual matching network MN0.

Reference is made, in this respect, to FIGS. 1 and 2.

The production of the real matching and filtering network MFN comprises replacing the inductive element L3 of the virtual direct current power supply stage DCFD0 by an LC arrangement 30, and replacing the inductive and capacitive elements of the virtual first section SCT01 by respective LC arrangements 11, 12. The LC arrangements 30, 11, 12 are configured to have an impedance equivalent to the matched impedance of the virtual matching network MN0 in the fundamental frequency band, and to further have resonant frequencies f30, f11, f12 (FIG. 5) respectively adapted to attenuate harmonic frequency bands of the fundamental frequency band.

Furthermore, the production of the real matching and filtering network MFN advantageously comprises replacing the capacitive element (or, alternatively, replacing the inductive element) of the virtual second section SCT02 with an LC arrangement, also configured to have an impedance equivalent to the matched impedance of the virtual matching network MN0 in the fundamental frequency band, and to further have a resonant frequency f22 (FIG. 5) matched to attenuate a harmonic frequency band of the fundamental frequency band.

In particular, the one or more inductive elements L0 of the virtual matching network MN0 are replaced by one or more parallel LC arrangements 11, having the same impedance at a frequency f0 chosen within the fundamental frequency band, and a respective resonant frequency fr.

On the one hand, the inductive value L31 is chosen together with the capacitive value C30 so as to position the resonant frequency of the LC filter (serial shunt L31, C30) at a desired value as seen from the output node of the power amplifier PA.

On the other hand, the inductive values L31, L32 of the inductive elements of the T-shaped LC arrangement 30, as well as the capacitive value C30 of the T-shaped LC arrangement 30, are chosen, together with the resonance in the chosen band, to have an imaginary part of the equivalent admittance equal to that desired for impedance matching at the output node of the PA, i.e. so that the whole T-shaped LC arrangement 30 has an impedance in the fundamental frequency band equivalent to the impedance of the inductive element L3 of the virtual network MN0.

The inductive values L and the capacitive values C of the components of the one or more parallel LC arrangements 11 are given, for each section SCT1 (SCT2), by the equations EQ3 and EQ4.

$$L = L_0\left[1 - \left(\frac{f_0}{f_r}\right)^2\right] \quad \text{EQ 3}$$

$$C = \frac{1}{L_0\left((2\pi f_r)^2 - (2\pi f_0)^2\right)} \quad \text{EQ 4}$$

Where L0 is the inductive value of the inductive element respectively replaced in each section SCT01 (SCT02), f0 is a frequency in the fundamental frequency band, and fr is the resonant frequency of the respective parallel LC arrangement.

Moreover, in particular, the one or more capacitive elements C0 of the virtual matching network MN0 are replaced by series LC arrangements 12, 22, having the same impedance at a frequency f0 chosen within the fundamental frequency band, and a resonance at a respective resonant frequency fr.

The capacitive values C and the inductive values L of the components of the series LC arrangements 12, 22 are given, for each section SCT1, SCT2, by the equations EQ5 and EQ6

$$C = C_0\left[1 - \left(\frac{f_0}{f_r}\right)^2\right] \quad \text{EQ 5}$$

$$L = \frac{1}{C_0\left((2\pi f_r)^2 - (2\pi f_0)^2\right)} \quad \text{EQ 6}$$

Where C0 is the capacitive value of the capacitive element respectively replaced in each section SCT01, SCT02, f0 is a frequency in the fundamental frequency band, and fr is the resonant frequency of the respective parallel LC arrangement.

The resonant frequencies fr are chosen to attenuate harmonic frequency bands of the fundamental frequency band.

Reference is now made to FIG. 5.

FIG. 5 shows the results of the matching and filtering network MFN as described with reference to FIG. 1 and obtained as described with reference to FIGS. 2 to 4, with an advantageous positioning of the resonant frequencies (fr) f11, f12, f22, f30.

Graph 51 shows the transmission gain of the matching and filtering network MFN, graph 52 shows the transmission gain of the network MFN in the fundamental frequency band FB, graph 53 shows the real part of the impedance of the network MFN in the fundamental frequency band FB, and graph 54 shows the imaginary part of the impedance of the network MFN in the fundamental frequency band FB.

The resonant frequency of the parallel LC arrangement 11 of the first section SCT1 is denoted f11, the resonant frequency of the series LC arrangement 12 of the first section SCT1 is denoted f12, the resonant frequency of the series LC arrangement 22 of the second section SCT2 is denoted f22, and the resonant frequency of the T-shaped LC arrangement 30 of the direct current power supply stage DCFD is denoted f30 (with reference to FIG. 1). The different resonant frequencies will be referred to directly by their respective references.

In one advantageous example, the resonant frequency f30 is positioned in one half, for example the top half, of the second harmonic frequency band HB2.

The resonant frequency f12 is positioned in the other half, for example the bottom half, of the second harmonic frequency band HB2.

The resonant frequency f22 is positioned in the third harmonic frequency band HB3.

The resonant frequency f11 is positioned between the fourth harmonic frequency band HB4 and the fifth harmonic frequency band HB5, i.e. in case of overlap of the fourth harmonic and fifth harmonic frequency bands HB4 and HB5, in the common portion of said bands HB4 and HB5.

On the one hand, this provides more than 35 dB of attenuation up to the fourth harmonic frequency band HB4 and more than 25 dB at the fifth harmonic frequency band HB.

Furthermore, this example corresponds to a space-optimised embodiment of the matching and filtering network MFN with optimised performance at high transmission frequencies.

On the one hand, in the case where the fundamental frequency band is so high that interfering inductive elements related to metallic connections to ground have effects that are not negligible in certain harmonic frequency bands (typically the fourth and fifth harmonics), then filtering of these harmonic frequency bands cannot take place with a ground-coupled series LC arrangement.

As a result, attenuation of the fourth and fifth harmonic frequency bands is firstly provided by the resonant frequency of the parallel LC arrangement 11 of the first section SCT1, without taking into account the overall dimensions added since parallel LC arrangements are the only options that are not subject to the problems of interfering inductances on the ground connections.

On the other hand, given that inductive elements have a much larger size and occupy a much larger space than capacitive elements in this type of embodiment; given that the capacitive elements C0 coupled to ground in the virtual matching network MN0 have lower values near the antenna ANT and higher values near the power amplifier PA; and given that the value of the inductive element required to resonate a capacitive element is inversely proportional to the capacitive value and to the square of the resonant frequency;

it is the inductive elements added to resonate the capacitive elements in series that should be minimised.

The smallest capacitive value C0 is thus firstly associated with the largest remaining resonant frequency, in this example the third harmonic frequency band HB3. This minimises the value of the inductive element L, determined by the equation EQ6, of the series LC arrangement 22 of the second section SCT2.

The capacitive element of the first section SCT01 of the virtual network MN0 is then chosen to resonate in the highest harmonic frequency band that has not yet been filtered, i.e. the second harmonic frequency band HB2. This minimises the value of the inductive element L, determined by the equation EQ6, of the series LC arrangement 12 of the first section SCT1, while additionally covering the second harmonic frequency band HB2.

Thus, both of the two inductive elements of the series LC arrangements 12, 22 of the two sections SCT1, SCT2 require minimal overall space, while having resonant frequencies respectively distributed in a manner adapted to attenuate the harmonic frequency bands which are not attenuated by the parallel LC arrangement of the first section HB3, HB2.

The resonant frequency of the T-shaped LC arrangement 30 can then be positioned more freely in the second harmonic frequency band HB2, since the additional space required by the added capacitive elements is small compared to the space required by the inductive elements, in particular compared to the space savings achieved by optimising the inductive elements of the series LC arrangements 12, 22.

The inductance of the second section SCT2 is not replaced by a resonant LC arrangement, in order to maintain a certain level of attenuation at high frequencies, which procures the best results in this configuration.

Graph 52 shows that the maximum loss in the fundamental band FB is in the order of 1.6 dB in this example.

Graphs 53 and 54 show that, in this example, the real part of the impedance is contained to substantially 10% around, for example, 3.5 ohms, and that the imaginary part is also well contained to substantially 10 pF (picofarads).

Alternatively to this example, in the case where the fundamental frequency band is not so high as to encounter the problem of interfering inductances in the metallic connections to ground, then the resonant frequencies f12, f22 can firstly be chosen for each series LC arrangement so as to be distributed in different harmonic frequency bands of the fundamental frequency band, and so that the series LC arrangements replacing the capacitive elements of the virtual matching network having the smallest capacitive values, have the largest resonant frequencies.

In other words, the smallest capacitive value C0 can firstly be associated with the largest desired resonant frequencies, i.e. in this alternative embodiment, the fourth and fifth harmonic frequency bands HB4, HB5; then the other capacitive element (i.e. the capacitive element of the first section SCT01 of the virtual network MN0) is chosen to resonate in the highest harmonic frequency band that has not yet been filtered, i.e. in this alternative embodiment, the third harmonic frequency band HB3.

The resonant frequencies are then chosen for each parallel LC arrangement and the low-pass T-shaped LC arrangement so as to be distributed, with the resonant frequencies of the series LC arrangements, in different harmonic frequency bands of the fundamental frequency band. The latter choices are not particularly restrictive in terms of space requirements, since the additional space required by the added capacitive elements is small compared to the space required by the inductive elements.

Thus, a matching and filtering technique has been described that is advantageous in both size and performance, with very inexpensive passive component arrangements.

To summarise, matching is carried out by a low-pass filter having two sections SCT01, SCT02 with a minimum quality factor in order to provide the real part of the impedance transformation.

The imaginary part of the optimum impedance of the power amplifier is produced by the inductive element L3 of the direct current power supply stage DCFD0.

A capacitive coupling element CC is added before the antenna to block the direct current voltage. The value thereof is chosen such that it is large enough to have little impact on the impedance transformation.

Harmonic rejection (filtering) is achieved by replacing the series inductive elements with parallel LC arrangements 11, and by replacing the shunt capacitor with series LC arrangements 12, 22. The equivalent reactance of the LC arrangements is kept equal to the reactance of the element they replace respectively, in the fundamental frequency band.

The inductive element L3 of the direct current power supply stage DCFD is also replaced by a low-pass T-shaped LC arrangement 30 to provide additional filtering at the resonant frequency of a T-shaped LC arrangement 30.

The resonant frequencies of the LC arrangements are advantageously chosen as follows:

The T-shaped LC arrangement, on the output of the power amplifier introduces a short-circuit into the top part (possibly the bottom part) of the second harmonic band;

The first parallel LC arrangement blocks between and within the fourth and fifth harmonic bands;

The first shunt series LC arrangement, on the output side of the power amplifier, discharges the frequencies in the bottom part (possibly the top part) of the second harmonic band;

The second shunt series LC arrangement discharges the frequencies in the third harmonic band.

The inductive element of the last section, on the antenna side, is not replaced by a resonant circuit in order to provide attenuation for higher order harmonics, i.e. greater than five.

The invention claimed is:

1. An integrated circuit, comprising:
a power amplifier configured to provide a signal in a fundamental frequency band;
an antenna coupled to an output of the power amplifier; and
a matching and filtering network circuit coupled between the power amplifier and the antenna, the matching and filtering network circuit comprising:
a direct current power supply stage coupled between a supply voltage node and an output node of the power amplifier,
a first section coupled between the output node of the power amplifier and an intermediate node, and
a second section coupled between the intermediate node and an input node of the antenna, each of the direct current power supply stage, the first section, and the second section comprising inductor-capacitor (LC) arrangements configured to have an impedance matched to the output of the power amplifier at the fundamental frequency band, and the LC arrangements of the direct current power supply stage and of the first section configured to have resonant frequencies adapted to attenuate harmonic frequency bands of the fundamental frequency band, wherein the series LC arrangement of the second section is configured to have a resonant frequency in the third harmonic frequency band.

2. The integrated circuit of claim 1, wherein LC arrangements of the second section comprises:
an LC arrangement configured to have a resonant frequency adapted to attenuate a harmonic frequency band of the fundamental frequency band; and
an inductive element or capacitive element configured to not introduce resonance positioned within a harmonic frequency band of the fundamental frequency band.

3. The integrated circuit of claim 1, wherein the second section comprises:
a series LC arrangement coupled between the input node of the antenna and a ground node; and
an inductive element coupled between the intermediate node and the input node of the antenna, or
a parallel LC arrangement coupled between the output node of the power amplifier and the input node of the antenna and a capacitive element coupled between the intermediate node and the input node of the antenna.

4. The integrated circuit of claim 1,
wherein the first section comprises a series LC arrangement coupled between the output node of the power amplifier and a ground node,
wherein the second section comprises a series LC arrangement coupled between the input node of the antenna and the ground node, and
wherein the second section is configured to have a resonant frequency greater than the resonant frequency of the series LC arrangement of the first section.

5. The integrated circuit of claim 1, wherein the direct current power supply stage comprises a low-pass T-shaped LC arrangement, and the first section comprises:
a parallel LC arrangement coupled between the output node of the power amplifier and the intermediate node; and
a series LC arrangement coupled between the intermediate node and a ground node.

6. The integrated circuit of claim 5, wherein the parallel LC arrangement of the first section is configured to have the highest resonant frequency among the resonant frequencies of the LC arrangements adapted to attenuate the harmonic frequency bands of the fundamental frequency band.

7. The integrated circuit of claim 5,
wherein the low-pass T-shaped LC arrangement is configured to have a resonant frequency in one half of the second harmonic frequency band,
wherein the series LC arrangement of the first section is configured to have a resonant frequency in the other half of the second harmonic frequency band, and
wherein the parallel LC arrangement of the first section is configured to have a resonant frequency either between the fourth harmonic frequency band and the fifth harmonic frequency band, or in a common portion of the fourth harmonic frequency band and of the fifth harmonic frequency band.

8. The integrated circuit of claim 1, wherein the second section is configured to have a resonant frequency greater than the resonant frequency of the series LC arrangement of the first section.

9. A method for impedance matching and filtering between an antenna and an output of a power amplifier providing a signal in a fundamental frequency band, the method comprising:

coupling a matching and filtering network between the power amplifier and the antenna, the matching and filtering network comprising:
a direct current power supply stage coupled between a supply voltage node and an output node of the power amplifier,
a first section coupled between the output node of the power amplifier and an intermediate node, and
a second section coupled between the intermediate node and an input node of the antenna, each of the direct current power supply stage, the first section, and the second section comprising inductor-capacitor (LC) arrangements, wherein the LC arrangements of the second section comprises an LC arrangement and one of an inductive element or a capacitive element;
determining the LC arrangements of each of the direct current power supply stage, the first section, and the second section to have an impedance matched to the output of the power amplifier at the fundamental frequency band;
determining the LC arrangements of the direct current power supply stage and of the first section to have resonant frequencies adapted to attenuate harmonic frequency bands of the fundamental frequency band;
determining the LC arrangements of the second section to have a resonant frequency adapted to attenuate a harmonic frequency band of the fundamental frequency band; and
determining the inductive element or capacitive element to not introduce resonance positioned within a harmonic frequency band of the fundamental frequency band.

10. The method of claim 9, wherein the second section comprises:
a series LC arrangement coupled between the input node of the antenna and a ground node; and
an inductive element coupled between the intermediate node and the input node of the antenna, or
a parallel LC arrangement coupled between the output node of the power amplifier and the input node of the antenna and a capacitive element coupled between the intermediate node and the input node of the antenna.

11. The method of claim 10, further comprising:
determining the series LC arrangement of the second section to have a resonant frequency in the third harmonic frequency band.

12. The method of claim 10, wherein the first section comprises a series LC arrangement coupled between the output node of the power amplifier and a ground node, wherein the second section comprises a series LC arrangement coupled between the input node of the antenna and the ground node, the method further comprising: determining the second section to have a resonant frequency greater than the resonant frequency of the series LC arrangement of the first section.

13. The method of claim 10,
wherein the direct current power supply stage comprises a low-pass T-shaped LC arrangement, and the first section comprises:
a parallel LC arrangement coupled between the output node of the power amplifier and the intermediate node; and
a series LC arrangement coupled between the intermediate node and a ground node, and
wherein the method further comprises:

determining the parallel LC arrangement of the first section to have the highest resonant frequency among the resonant frequencies of the LC arrangements adapted to attenuate the harmonic frequency bands of the fundamental frequency band.

14. The method of claim 13, further comprising:

determining the low-pass T-shaped LC arrangement to have a resonant frequency in one half of the second harmonic frequency band;

determining the series LC arrangement of the first section to have a resonant frequency in the other half of the second harmonic frequency band; and determining the parallel LC arrangement of the first section to have a resonant frequency either between the fourth harmonic frequency band and the fifth harmonic frequency band, or in a common portion of the fourth harmonic frequency band and of the fifth harmonic frequency band.

15. The method of claim 9, further comprising determining the second section to have a resonant frequency greater than the resonant frequency of the series LC arrangement of the first section.

16. A matching and filtering network circuit, the matching and filtering network circuit coupled between an antenna and an output of a power amplifier configured to provide a signal in a fundamental frequency band; the matching and filtering network circuit comprising:

a direct current power supply stage coupled between a supply voltage node and an output node of the power amplifier, a first section coupled between the output node of the power amplifier and an intermediate node, and a second section coupled between the intermediate node and an input node of the antenna, each of the direct current power supply stage, the first section, and the second section comprising inductor-capacitor (LC) arrangements configured to have an impedance matched to the output of the power amplifier at the fundamental frequency band, and the LC arrangements of the direct current power supply stage and of the first section configured to have resonant frequencies adapted to attenuate harmonic frequency bands of the fundamental frequency band wherein the second section is configured to have a resonant frequency greater than the resonant frequency of the series LC arrangement of the first section.

17. The matching and filtering network circuit of claim 16, wherein LC arrangements of the second section comprises:

an LC arrangement configured to have a resonant frequency adapted to attenuate a harmonic frequency band of the fundamental frequency band; and an inductive element or capacitive element configured to not introduce resonance positioned within a harmonic frequency band of the fundamental frequency band.

18. The matching and filtering network circuit of claim 16, wherein the second section comprises:

a series LC arrangement coupled between the input node of the antenna and a ground node, the series LC arrangement configured to have a resonant frequency in the third harmonic frequency band; and an inductive element coupled between the intermediate node and the input node of the antenna, or a parallel LC arrangement coupled between the output node of the power amplifier and the input node of the antenna and a capacitive element coupled between the intermediate node and the input node of the antenna.

19. The matching and filtering network circuit of claim 16, wherein the first section comprises a series LC arrangement coupled between the output node of the power amplifier and a ground node, and wherein the second section comprises a series LC arrangement coupled between the input node of the antenna and the ground node.

20. The matching and filtering network circuit of claim 16, wherein the direct current power supply stage comprises a low-pass T-shaped LC arrangement, and the first section comprises:

a parallel LC arrangement coupled between the output node of the power amplifier and the intermediate node; and a series LC arrangement coupled between the intermediate node and a ground node.

* * * * *